United States Patent
Frodsham et al.

(10) Patent No.: US 7,681,093 B2
(45) Date of Patent: Mar. 16, 2010

(54) REDUNDANT ACKNOWLEDGMENT IN LOOPBACK ENTRY

(75) Inventors: Tim Frodsham, Portland, OR (US);
Zale Schoenborn, Portland, OR (US);
Sanjay Dabral, Palo Alto, CA (US);
Muraleedhara Navada, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 972 days.

(21) Appl. No.: 11/395,879

(22) Filed: Mar. 31, 2006

(65) Prior Publication Data
US 2007/0264730 A1  Nov. 15, 2007

(51) Int. Cl.
*G01R 31/28* (2006.01)

(52) U.S. Cl. .................. 714/716; 714/713; 370/243; 370/249

(58) Field of Classification Search .............. 714/716, 714/713; 370/243, 249
See application file for complete search history.

(56) References Cited

U.S. PATENT DOCUMENTS

| | | | |
|---|---|---|---|
| 6,834,139 B1* | 12/2004 | Prairie et al. ................. 385/24 |
| 7,366,964 B2* | 4/2008 | Frodsham et al. .......... 714/716 |
| 7,492,719 B2* | 2/2009 | Lim et al. ................. 370/241.1 |
| 7,512,092 B2* | 3/2009 | Laurila ........................ 370/328 |
| 2001/0013106 A1* | 8/2001 | Asano .......................... 714/43 |
| 2002/0075891 A1* | 6/2002 | Souissi ....................... 370/442 |
| 2004/0136713 A1* | 7/2004 | Lim et al. ...................... 398/66 |
| 2005/0083835 A1* | 4/2005 | Prairie et al. ................ 370/224 |
| 2006/0132265 A1* | 6/2006 | Laurila ........................ 333/238 |
| 2006/0245368 A1* | 11/2006 | Ladden et al. .............. 370/248 |

\* cited by examiner

*Primary Examiner*—M. Mujtaba K Chaudry
(74) *Attorney, Agent, or Firm*—Blakely, Sokoloff, Taylor & Zafman LLP

(57) ABSTRACT

Redundant acknowledgment between agents performing a loopback test over bidirectional communications bus is described. In one example the acknowledgment is performed by initiating loopback communications from a first agent to a second agent, sending a packet including a redundant acknowledgment sequence from the first agent to the second agent, receiving the packet including the redundant acknowledgement sequence looped back from the second agent at the first agent, sending a test sequence from the first agent to the second agent, and receiving the test sequence looped back from the first agent.

20 Claims, 6 Drawing Sheets

US 7,681,093 B2

REDUNDANT ACKNOWLEDGMENT IN LOOPBACK ENTRY

FIELD

The present description relates to the field of testing high-speed point-to-point link communications between microelectronic devices and, in particular, to robust inband acknowledgments for serial device communications.

BACKGROUND

Microelectronic devices contain progressively more logic functions in a single integrated circuit device or a system on a chip (SoC). Modern microelectronic devices may include large numbers of gates on a single semiconductor chip, with these gates interconnected so as to perform multiple and complex functions. Such complex devices may require extensive testing to ensure that all of the necessary components perform properly.

With increasing complexity, the cost and complexity of verifying and electrically testing the individual devices and groups of devices in a system also increases. Part of the increased cost and complexity is connected with increasing numbers of functional pins on a device. In some systems, each functional I/O pin must be tested in several different ways and its ability to communicate with I/O pins on other devices must also be tested. Computer architectures with multiple agents, such as, a plurality of caching agents and home agents coupled to a network fabric may require testing for communication between each connected agent. With a master and slave agent, factors that may increase testing complexity include external control for chipset agents, testing register settings for both master and slave agents, and a lack of test standardization for high speed I/O interfaces.

BRIEF DESCRIPTION OF THE FIGURES

The invention may be more fully appreciated in connection with the following detailed description taken in conjunction with the accompanying drawings, in which like reference numerals refer to corresponding parts throughout the several views of the drawings, and in which.

DETAILED DESCRIPTION

An area of current technological development relates to reducing test complexity and cost. In loopback testing, the communicating agents may be described as a master agent, that sends test sequences and a slave agent that loops the test sequence back to the master agent. In a high speed pTp (point-to-point) network, such as a CSI (Common System Interface promulgated by Intel Corp) network, loopback overrides on many communicating agents may be controlled by the master agent. For example, a master agent, typically a microprocessor, may be used to control aspects of the loopback testing, including setting sets of registers, sending test sequences and communicating with higher layers of test software to manipulate the registers and bits to enable and obtain complicated test programs and interface information.

The CSI environment uses several different caching agents and home agents coupled to a network fabric. The network fabric may include a link layer, a protocol layer, a routing layer, a transport layer, and a physical layer. The fabric transports messages from one protocol (home or caching agent) to another protocol. Transmitters and receivers of a CSI port, or two different CSI ports may be attached to each other and test patterns are generated and checked while the interface electrical and timing parameters are stressed.

One agent, designated as the master agent, controls the various overrides in the transmitter and receiver of both the master and the slave agents. In CSI, the master agent may send the loopback control and overrides from the master agent in band, requiring little to no external control. Alternatively, the override information may come from a test access port (TAP).

While embodiments of the present invention are described in the context of a CSI network, embodiments of the invention may be adapted to many different types of loopback communications that use inband or out-of-band signaling including FBD-2 (Fully Buffered DIMM (Dual In-line Memory Module) 2) Advanced Memory Buffer/Bus, PCI-Express (Peripheral Component Interconnect-Express), and SATA (Serial Advanced Technology Attachment), among others.

Figure 1:
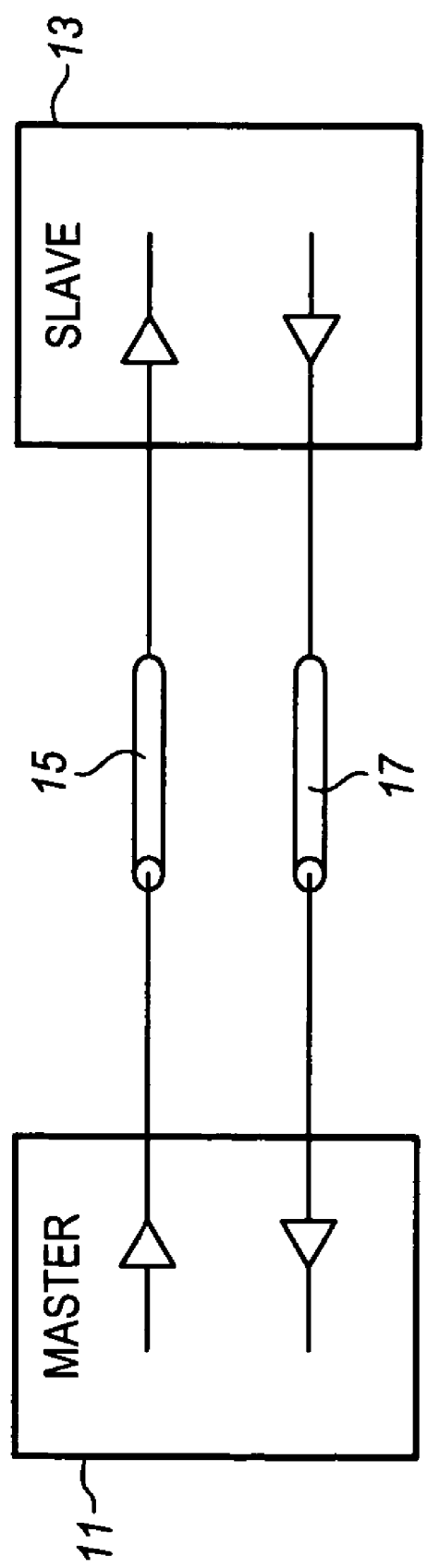
FIG. 1 is a block diagram of two agents communicating over a bidirectional communications bus in accordance with an embodiment of the invention.

In FIG. 1, a master agent 11 is coupled to a slave agent 13. A first data line 15 allows the master agent to send bits or data to the slave agent. A second data line 17 allows the slave agent to send bits or data to the master agent. These lines may be high speed serial or parallel lines of a variety of different types. They may include one or more lanes. In one example, there may be 20 lanes. The lines may be multiplexed, duplexed, or interlaced. While only two agents are shown, more agents may be connected using the same or different lines. The agents may be any of a variety of different microelectronic devices. In one embodiment, the master agent is a microprocessor, a controller hub, a firmware hub, or a bus controller, and the slave agent may be a memory controller hub, a chipset, a north bridge, a memory module or a set of memory modules, a PCI Express bus controller or a variety of other microelectronic devices. The roles of master agent and slave agent may also be reversed to suit a particular application.

Figure 2:
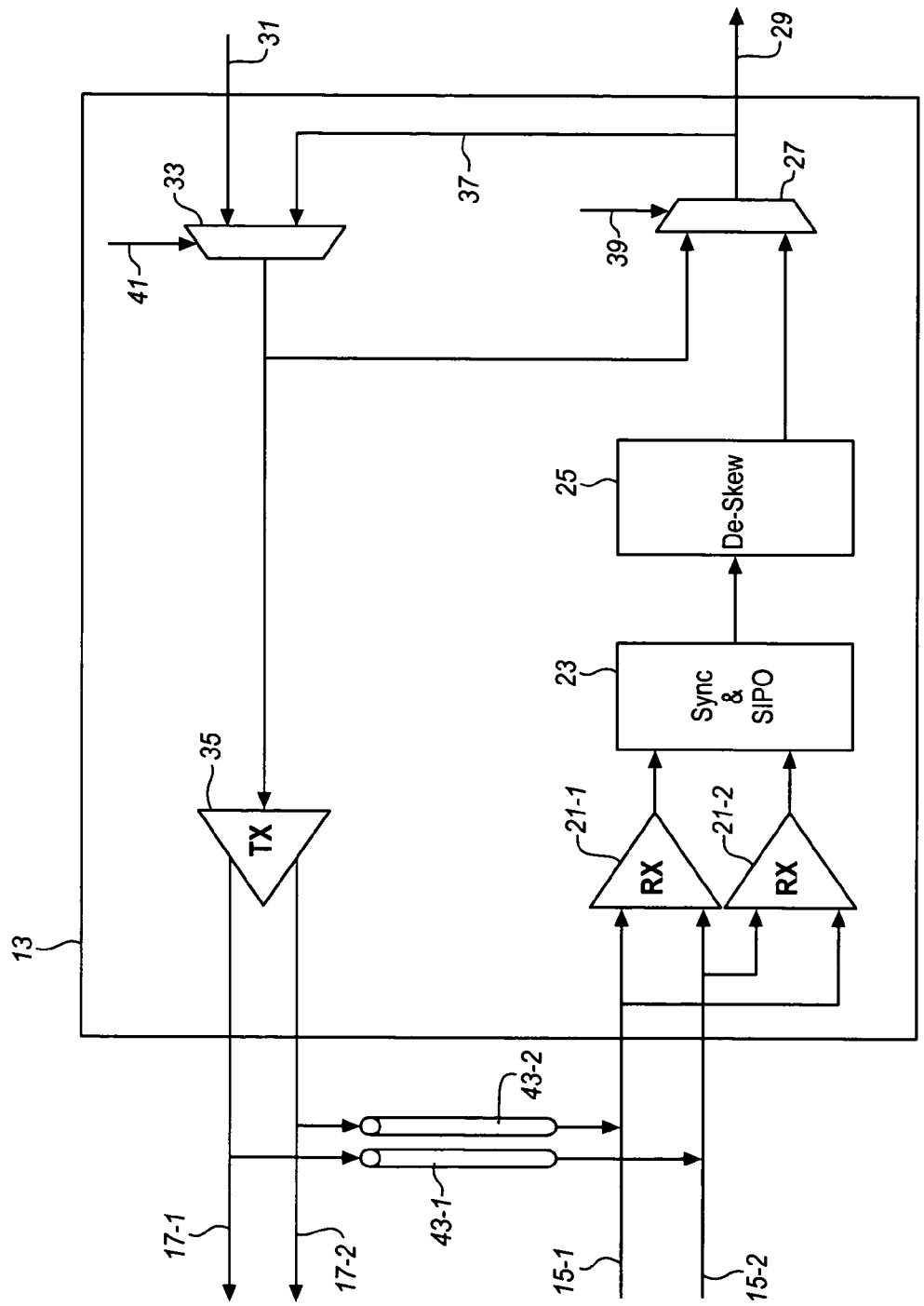
FIG. 2 is a block diagram of the components of one of the agents of FIG. 1 in more detail.

FIG. 2 shows a variety of different possible loopback modes that may be used by an agent 13, such as a slave agent of FIG. 1. Data or packets are received on the receive lines 15-1, 15-2 in a pair of RX amplifiers 21-1, 21-2 and processed in various receive devices, such as a synchronizer 23 and a de-skew device 25. The received signal may then be forwarded to one or more multiplexers 27 and then to higher layers on an internal received signal line 29. The received signal may be looped back through the higher layers from an internal transmit line 31. This line may be coupled to a multiplexer 33 that passes the signal to a transmit amplifier 35.

Alternatively, the agent 13 may use the receive and transmit multiplexers to loopback the received signal at the physical layer directly through a loopback line 37 that connects the two multiplexers together. FIG. 2 shows a control line 39, 41 at each multiplexer to allow the internal physical layer loopback to occur. The agent may also provide a third loopback mode using external loopback circuits 43-1, 43-2 and associated switching devices (not shown). The external loopback circuits allow the received signal to be looped back before it enters the agents' internal receive, transmit or processing circuitry.

Figure 3A:
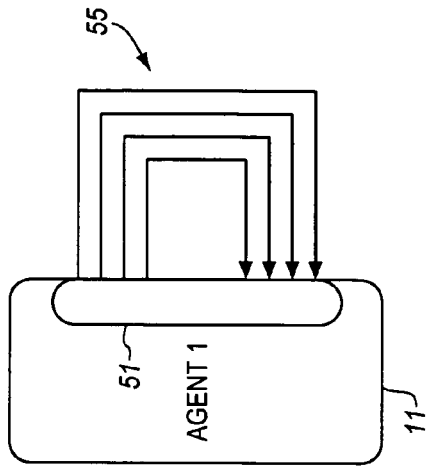
FIG. 3A is a diagram of a remote loopback test between two agents according to an embodiment of the invention.
Figure 3B:
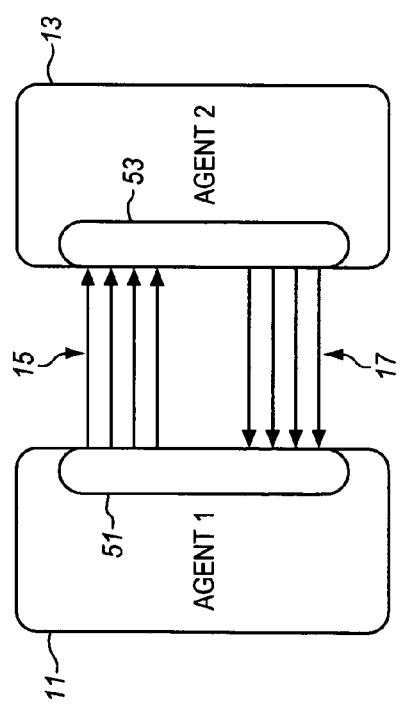
FIG. 3B diagram of a local loopback inter-link test for one agent according to an embodiment of the invention.
Figure 3C:
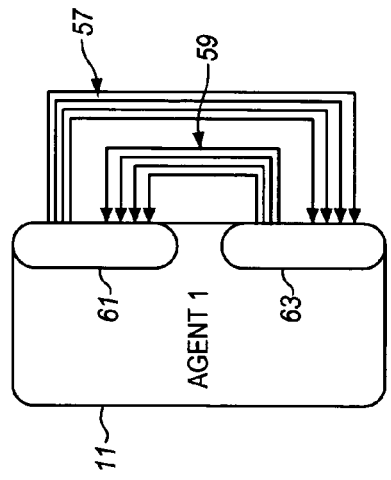
FIG. 3C is a diagram of a local remote loopback intra-link test for one agent according to an embodiment of the invention.

In FIG. 3A, a simplified diagram of a master-slave loopback configuration similar to that of FIG. 1 is shown. FIGS. 3A, 3B, and 3C show three different types of loopback tests, a remote loopback (3A), a local loopback inter-link (3B), and a local loopback intra-link (3C). The configuration of FIG. 3A has two agents 11, 13, two communication links 15, 17, one for each direction of travel and respective loopback circuits 51, 53, one for each agent. This configuration may be adapted to allow the link layer to configure either of the agents as either a master or a slave at power up. The loopback tests may be performed with the master configured agent supporting pattern generation, results comparison, and error detection. This configuration may be used for remote loopback in which the loopback path is between different links on different devices.

In the example of FIG. 3B, loopback communication lines 55 transmit signals from the first agent 11 and return them back to the first agent 11 independent of any other devices. The local loopback is a loopback between the transmitters 51 and receivers 51 of the same agent. This may be referred to as an Intra-Link for the agent.

In the example of FIG. 3C, the local loopback is an Inter-Link loopback. In this Inter-Link loopback, the loopback happens between transmitters and receivers of two separate links 61, 63 in the same agent. One link of the agent may be designated as the master and the other link as the slave. In contrast, the Intra-Link local loop does not have a slave agent, rather, the device is programmed as the master and the device's receivers and transmitters are looped back to each other. The overrides on any one of the configurations of FIGS. 3A, 3B, and 3C may occur through any external access mechanism, such as, a test access port (TAP). The example configurations of FIGS. 3A, 3B, and 3C are provided as examples only. A variety of other configurations using more or fewer agents may be used.

Figure 4:
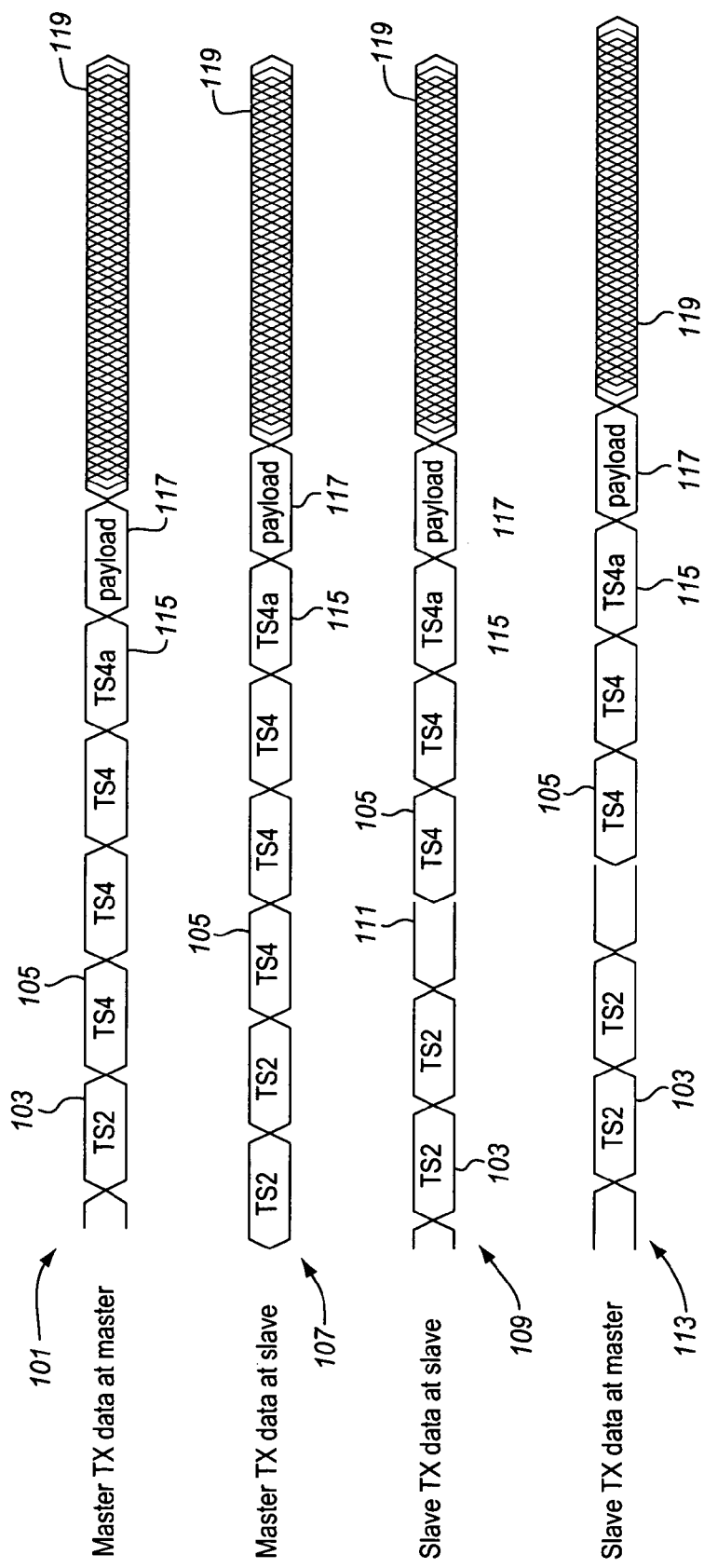
FIG. 4 is a signaling diagram of a loopback test for any of the configurations of FIG. 3A, 3B, or 3C.

FIG. 4 shows an example timing diagram for entering loopback according to an embodiment of the invention. Loopback may be entered to allow a variety of different transmission tests to be performed. These may include bit locking, lane de-skewing, latency fixation, bit modulation, and various detect modes. The example of FIG. 4 is particularly suitable for communications between a microprocessor and a memory controller hub (MCH), however, it may also be applied to a variety of other connections between different agents.

In FIG. 4, the master agent in the first timing line 101 is engaged in polling and is sending a packet labeled "TS2" 103 to the slave agent. The packets are shown as progressing from the master on the left to the slave on the right. The master agent may be a microprocessor and the slave agent an MCH, however, the designation of master and slave may be changed or varied to suit a particular application.

Entry into a loopback function is based at least in part on a predetermined header of a predetermined packet type. In the example of FIG. 4, the packet type is labeled "TS4" 105. This packet has a header to indicate loopback entry. The packet header controls the entry into the loopback mode, and may be followed by a payload that provides override information for the slave agent. It may also provide for synchronization and timing between the two agents. In one example, the TS4 packet type has 8 bytes, with byte 0 used as a header with a value of "11100010". However, different size packet and different headers may be used. Alternatively, the unique sequence may be a footer or in another portion of the sequence.

The second timing line 107 indicates the delay in the transmission line between when the master agent transmits the data and when the slave agent receives it. Packets are shown as progressing from the left to the right. The amount of the delay may often be unknown and may vary with many different factors, such as, the routing length between the agents and the timing variance due to temperature and voltage excursions. From one initialization to the next, the latency between the two agents can vary by several UI (unit intervals)

A synchronization may be performed to allow the slave agent to know when the loopback data has arrived. The synchronization also allows the master agent to know when the slave has acknowledged loopback entry, and when the loopback data has returned to the master. When the loopback data has returned to the master, the master can begin checking the data according to the corresponding tests. The synchronization may be performed using the loopback header. As shown in the first 101 and second 107 timing lines, the master sends a TS4 header to the slave. The slave recognizes the TS4 header and then sets up and defines the loopback path between the master to slave.

The third timing line 109 shows the TS2 and TS4 packets progressing from the slave on the left to the master on the right. The third timing line shows an unknown amount of delay 111 between the first TS4 packet's receive time at the slave and its transmission time from the slave. The fourth timing line 113 shows the packets progressing from left to right as they are received at the master. The delay between the transmission from the slave in the third line and the receipt at the master in the fourth line is similar to the delay between the first and second lines. The loopback master sees the TS4 packets coming back from the slave in the fourth timing line and knows that the slave has acknowledged and entered loopback mode.

The acknowledgment of the loop back mode begins when the master sets an ACK (acknowledgment) sequence in a TS4 packet 115, appends a payload 117 to the transmit stream and begins transmission of a test pattern 119. In one embodiment, the loopback test patterns are stored in a 40 bit deep single pattern generator register for all of the lanes of a communication link. There may be 20 lanes for the link, however, the specific nature of the test pattern or patterns, how they are generated and stored and the nature of the communication lanes may vary depending on the particular application.

When the slave receives the TS4 packet with the ACK sequence 115, and the payload packet 117, the slave agent interprets and implements the overrides in the payload packet. The overrides in the payload packet may refer to the offset, driver current, and sampling controls among other parameters depending on the particular application.

The slave then loops back the TS4 packet with the ACK sequence 115, the payload packet 117 and the test pattern 119 to the master agent, as shown in the third timing line. In loopback mode, the slave may ignore the subsequent pattern data in the test pattern 119. When the master receives the TS4 packet with the ACK sequence, as shown in the fourth timing diagram, it can measure the elapsed time between transmitting the packet and receiving the packet looped back. Based on that measurement, it knows when to expect the return of the test pattern data that it transmitted. This allows it to begin checking the test pattern with the right timing.

As described above, the ACK sequence may be important to the advancement to the test state and to the timing of the advancement. To ensure accurate timing, only one ACK sequence is sent. This makes the single sequence more difficult to reliably receive. In addition, the entry into loopback does not require any assumptions, such as timers. The entry into loopback may be made based solely on receiving looped back packets. This may also make the packet more difficult to reliably receive. At the same time, loop back test sequences are often used to analyze and test a transmission line or transmission lanes. Accordingly, there may be errors in the transmission and reception of looped back packets. This makes the single ACK sequence more difficult to reliably receive.

In order to provide an increased tolerance to faults in the transmission path, for the transmitter and for the receiver, the ACK sequence may be redundant. In one example as shown in the Table, the redundant ACK (RACK) sequence contains four bits. The master transmits the ACK sequence as four bits set to "0." The slave validates the acknowledgment in the transmitted packet by resetting all four bits to "1."

When the master receives the TS4 packet with the acknowledgment, it may then analyze the ACK sequence portion. Any of a variety of different algorithms may be used to determine whether a received ACK sequence is valid. In one embodiment, an ACK is valid when any three or more of the four received bits are set to "1." In other applications, an ACK may be deemed valid when either one or more, or two or more of the four received bits are set to "1." The redundant ACK bits allows the ACK sequence to be received even if there are errors introduced in the communication path and whether the errors are in the transmit path or the receive path.

TABLE

| RACK | |
|---|---|
| TX ACK | 0000 |
| RX ACK | 1111 |

Since the redundant ACK sequence is redundant in both directions, it increases fault tolerance for both the master and the slave. In order to apply the overrides and enter loopback in the example of FIG. 4, the slave must also reliably receive the ACK sequence. The slave may apply an approach similar to that of the master to determine whether the ACK sequence that it receives is valid. So, for example, if any three or more of the received bits of the ACK sequence are set to "0," then the slave may recognize the ACK apply the overrides and enter loopback. Otherwise, the slave may not recognize the packet as anything other than a regular TS4 105. When the master does not receive the TS4 with the ACK bits reset, it may retry the loopback entry sequence.

While the redundant ACK is described with four redundant bits as shown in the Table, many variations and modifications are possible. The number of bits may be changed. As few as three bits may be used or many more bits may be used. The number of bits may be selected to coincide with the size of a byte or a word on the bus. Accordingly, 8, 16, or 32 bits may be used. In addition, the values for the bits may be modified to suit different applications. For example the TX ACK may be set to all "1". The TX ACK and the RX ACK may also be set to have the same value. Alternatively, the values for each ACK sequence may be a combination of 1's and 0's. The combinations may be selected to improve transmission over the communication path, for more robust identification or for other reasons.

Figure 5:
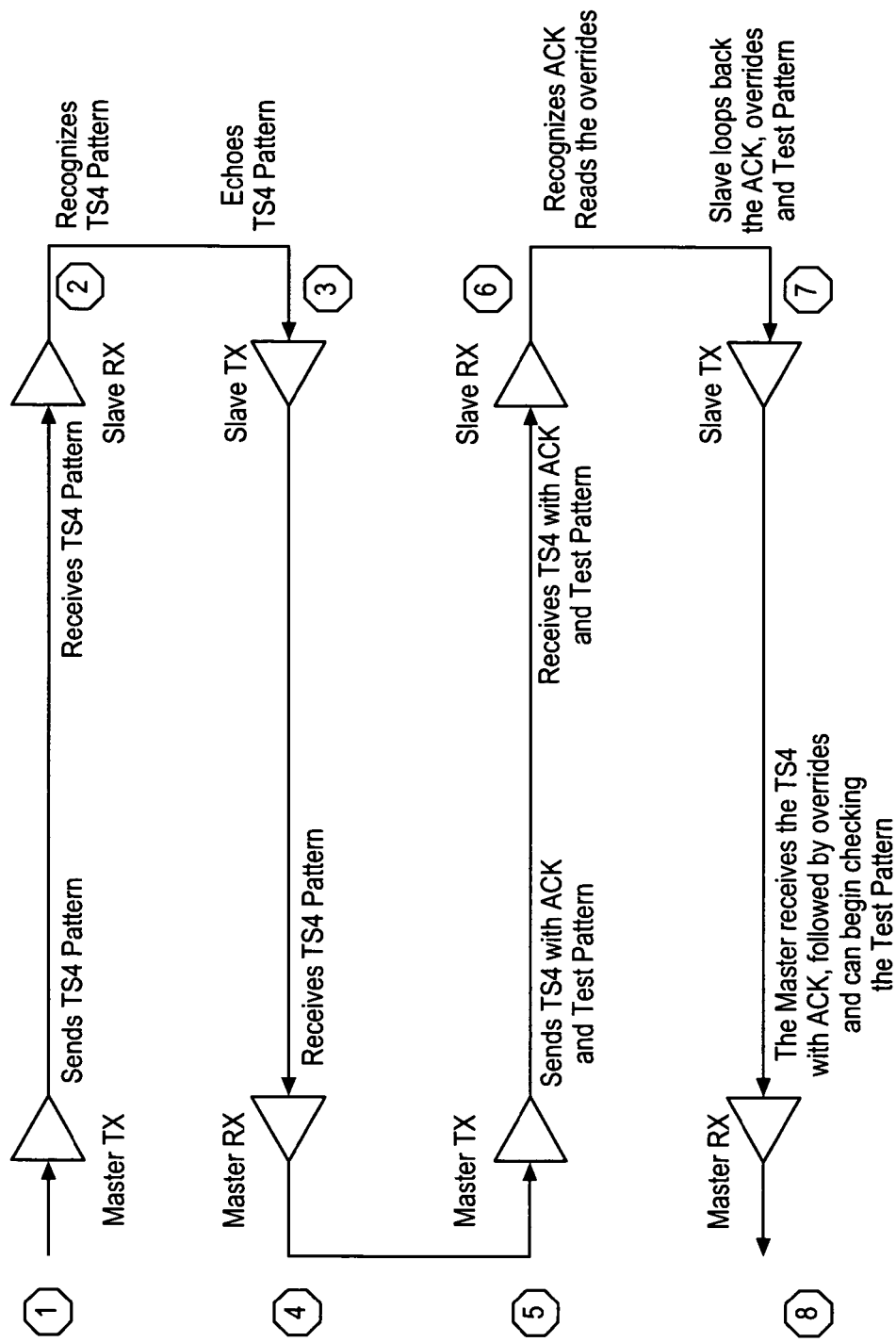
FIG. 5 is a signaling diagram of the loopback test of FIG. 4 with acknowledgments according to an embodiment of the invention.

FIG. 5 shows loopback entry as described above in the context of FIG. 4 as a handshake between the master on the left and the slave on the right. At 1, the loopback master agent sends a TS4 packet pattern after exiting a polling state. At this time, the loopback slave agent continues to transmit TS2 packets (not shown). At 2, the slave receives the TS4 pattern, and recognizes it. At 3 the slave stops the current TS2 pattern it is transmitting and echoes back the TS4 pattern to the master.

At 4, the master receives the TS4 pattern echoed back from the slave. This completes the loopback entry handshaking. In the example of FIG. 4, the master will continue to transmit TS4 packets until it is ready to begin a test pattern. This may be immediately after completing the handshake at 4 or it may be later.

At 5, the master looks at the looped back TS4 pattern as an indication that slave has entered loopback mode and then sends a TS4 packet with RACK sequence, followed by an override sequence, if appropriate and a test pattern. At 6, these are received by the slave. The slave determines if the RACK is valid, resets the RACK bits to indicate an acknowledgment, applies the overrides, and loops back the two packets and the test sequence to the master at 7.

As mentioned above, the overrides may relate to any settable parameters of the slave such as receive parameters, echo parameters, lane settings, masks, strobe and equalizer settings and more. The parameters for the slave may be different from those for the master. The parameters may also define aspects of the test sequences to follow or how the test sequence is to be used. These parameters may be set based on the data fields in the TS4 packet's payload and then used to echo anything following the TS4 packet. In one embodiment, the slave switches to these new parameters only after echoing back the TS4 with RACK so that the master receives the RACK without any changes from the parameters. If the override parameters are inappropriate for the communication path, then they will not interfere with communication of the RACK.

At 8, the master receives the TS4 with the RACK. It also receives the overrides looped back from the slave and the looped back test pattern with the overrides applied. Given the timing in the RACK, after it has determined that the RACK is valid, it may start checking the test pattern. In one embodiment, the Master agent contains the necessary logic to look for pattern mismatches and appropriately updates a loopback status register with the results.

The loopback mode may be exited in any of a variety of different ways. Loopback may be entered with a finite loop count. This provides for a seamless exit. When the requisite number of loopback patterns have been sent and received, the transmitter and receiver both drop out of loopback, and restore the original settings. A loopback recovery packet may be sent, followed by a return to a polling state or some other base state. If the loopback count is infinite or there is no count, then there may be a specific exit handshake. An infinite loopback count may be used, for example, to perform design validation on the agents. The loopback mode may be exited in such an example by dropping and restarting forwarded clocks or by another inband reset.

In such an example, the master may issue an in-band reset by stopping a forwarded clock. The slave detects the loss of clock, exits loopback mode and issues its own in-band reset. The master detects the in-band reset from the slave, re-starts the clock and begins link initialization.

The redundant ACK messages may also be used for Inband signaling over the communication path in other contexts. For example, normal operation for some communication paths allows the physical layer to transition from a detect state to an L0 state after a power good signal has been asserted from a higher layer. The higher layer may be at any a variety of higher layers, the link layer, the protocol layer, the routing layer, or the transport layer. In this example, the L0 state is the normal operational state of the link. The L0 state transition marks the beginning of system time for a variety of different counters and timers. Using a redundant ACK for the L0 transition through Inband signaling, increases the certainty that both agents use the same start time.

Figure 6:
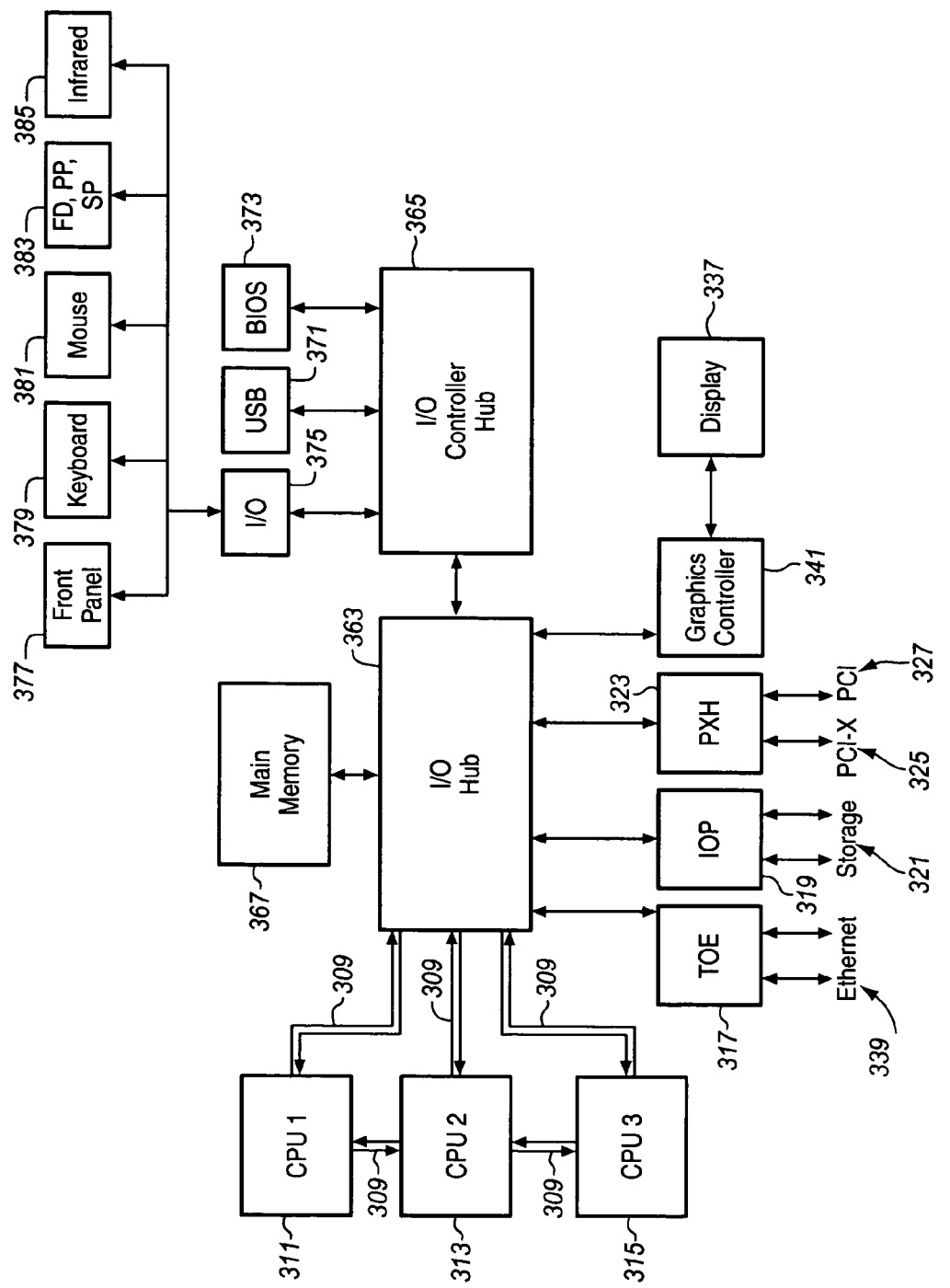
FIG. 6 is a block diagram of a computer system with bidirectional communications buses suitable for implementing embodiments of the present invention.

FIG. 6 shows an example of a computer system suitable for implementing the present invention. An IOH (Input/Output Hub), north bridge, or host controller 363 interfaces one or more CPUs (central processing unit) with memory and I/O devices and may provide a wide range of other features such as increased performance, reliability, availability and serviceability, and system management. It may include I/O clusters, a memory controller, snoop filters, and a wide range of logic for handling transactions. While the example of FIG. 3, includes a microprocessor coupled to a IOH and an ICH (Input/Output Controller Hub), either the IOH or the ICH or both or any of the functions of these chips may be incorporated into any one or more of the microprocessors. The IOH and the ICH may also be combined, in whole or in part, inside of or outside of the microprocessor.

In the example of FIG. 6, the IOH 363 has a CSI link 309 for each of three CPUs or processor cores 313, 315. More or less than one IOH, three processor cores and CSI links may be used. As shown in the diagram, CPU1 has direct link to CPU 2 and the IOH, but CPU 1 and CPU 2 communicate only through CPU 2 or the IOH. An additional CSI link may be provided to allow CPU 1 and CPU 2 to communicate with each other directly. Alternatively, CSI links may be removed so that all of the CPUs communicate through one of the other CPUs or the IOH.

The IOH provides additional connectivity to other devices. There is an interface to system memory 367, such as DIMMs (Dual In-line Memory Modules) in which instructions and data may be stored, and a high speed interface, such as a PCI (peripheral component interconnect) Express. The PCI Express interface may be used to couple to a variety of different high and low speed devices. In the example of FIG. 3, six x4 PCI Express lanes are shown. Two lanes connect to a TCP/IP (Transmission Control Protocol/Internet Protocol) Offload Engine 317 which may connect to network or TCP/IP devices such as a Gigabit Ethernet controllers 339. Two lanes connect to an I/O Processor node 319 which can support storage devices 321 using SCSI (Small Computer System Interface), RAID (Redundant Array of Independent Disks) or other interfaces. Two more lanes connect to a PCI translator hub 323 which may support interfaces to connect PCI-X 325 and PCI 327 devices. Two, four or more lanes of PCI Express couple to a graphics controller 341 to render images or video on a display 337. The PCI Express interface may support more or fewer devices than are shown here. In addition, the IOH may be adapted to support other protocols and interfaces instead of, or in addition to those described.

The IOH may also be coupled, using PCI Express or another bus to an ICH. The ICH 365 offers possible connectivity to a wide range of different devices. Well-established conventions and protocols may be used for these connections. Alternatively, these connections may be provided using the PCI interface 327 or another interface. The connections may include a SIO (Super Input/Output) port 375, a USB hub 371, and a local BIOS (Basic Input/Output System) flash memory 373. The SIO (Super Input/Output) port 375 may provide connectivity for a front panel 377 with buttons and a display, a keyboard 379, a mouse 381, and infrared devices 385, such as IR blasters or remote control sensors. The I/O port may also support floppy disk, parallel port, and serial port connections 383. Alternatively, any one or more of these devices may be supported from a USB, PCI or any other type of bus or interconnect. Wireless interfaces such as Bluetooth and WiFi may also be supported from any one or more of these busses.

The particular nature of any attached devices may be adapted to the intended use of the device. Any one or more of the devices, buses, or interconnects may be eliminated from this system and others may be added. For example, video may be provided on the PCI bus, on an AGP bus, through the PCI Express bus or through an integrated graphics portion of the host controller or a processing core.

It is to be appreciated that a lesser or more equipped agent communication protocol, acknowledgment message, communications bus, and computer environment than the examples described above may be preferred for certain implementations. Therefore, the configuration of the signaling system and the computer system will vary from implementation to implementation depending upon numerous factors, such as price constraints, performance requirements, technological improvements, or other circumstances. Embodiments of the invention may also be applied to other types of software-driven systems that use different hardware architectures than that shown in the Figures.

While embodiments of the invention have been described in the context of an input/output hub chip coupled to a microprocessors, memory, and other interconnects, embodiments of the invention may also be applied to a wide range of other devices capable of communicating over a CSI bus. In addition, embodiments of the invention may be applied to any device communications interface that transfers data bidirectionally in a loopback test. Embodiments of the invention may also be applied to a wide variety of chips with simpler communications interfaces or test procedures In the description above, for purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

The present invention may include various steps. The steps of the present invention may be performed by hardware components, such as those shown in the Figures, or may be embodied in machine-executable instructions, which may be used to cause general-purpose or special-purpose processor or logic circuits programmed with the instructions to perform the steps. Alternatively, the steps may be performed by a combination of hardware and software.

The present invention may be provided as a computer program product which may include a machine-readable medium having stored thereon instructions which may be used to program an agent or a computer system to perform a process according to the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of machine-readable media suitable for storing electronic instructions. Moreover, the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and apparatus are described in their most basic form but steps may be added to or deleted from any of the methods and components may be added or subtracted from any of the described apparatus without departing from the basic scope of the present invention. It will be apparent to those skilled in the art that many further modifications and adaptations may be made. The particular embodiments are not provided to limit the invention but to illustrate it. The scope of the present invention is not to be determined by the specific examples provided above but only by the claims below.

What is claimed is:

1. A method comprising:
   initiating loopback communications from a first agent to a second agent;
   sending a packet including a redundant acknowledgment sequence from the first agent to the second agent;
   receiving the packet including the redundant acknowledgement sequence looped back from the second agent at the first agent;
   sending a test sequence from the first agent to the second agent;
   receiving the test sequence looped back from the first agent;
   determining whether the received redundant acknowledgment sequence is valid; and
   if the received redundant acknowledgment sequence is determined to be valid, then checking the received test sequence.

2. The method of claim 1, wherein determining whether the received redundant acknowledgment sequence is valid comprises determining whether at least some number of bits of the received redundant acknowledgment sequence are correct.

3. The method of claim 1, wherein the redundant acknowledgment sequence comprises at least three bits.

4. The method of claim 1, wherein the redundant acknowledgment sequence comprises a sequence of bits of the same value.

5. The method of claim 1, wherein initiating loopback communications comprises sending a packet containing override information from the first agent to the second agent.

6. The method of claim 5, wherein the override information includes offset and compensation values for the second agent to apply to configuration registers.

7. The method of claim 1, further comprising exiting a polling state before initiating loopback communications.

8. The method of claim 1, further comprising analyzing the looped back test sequence and setting communications parameters based thereon.

9. The method of claim 1, wherein initiating loopback comprises recognizing that the second agent has entered a loopback mode by receiving a sent packet looped back from the second agent and wherein sending a packet including a redundant acknowledgment is performed after recognizing that the second agent has entered the loopback mode.

10. A method comprising:
    initiating loopback communications at a second agent;
    receiving a packet including a redundant acknowledgment sequence from the first agent at the second agent;
    looping the packet including the redundant acknowledgement sequence back to the first agent from the second agent;
    receiving a test sequence from the first agent at the second agent;
    looping the test sequence back to the first agent;
    determining whether the received redundant acknowledgment sequence is valid; and
    looping back the test sequence if the received redundant acknowledgment sequence is determined to be valid.

11. The method of claim 10, wherein looping back the test sequence comprises looping back the test sequence only if the received redundant acknowledgment sequence is determined to be valid.

12. The method of claim 10, wherein initiating loopback communications comprises responding to packets received from the first agent.

13. The method of claim 10, wherein initiating loopback communication comprises receiving a packet containing override information from the first agent and applying the received override information at the second agent.

14. An article including a machine-readable medium comprising data stored thereon that when operated on by the machine cause the machine to perform operations comprising:
    initiating loopback communications from a first agent to a second agent;
    sending a packet including a redundant acknowledgment sequence from the first agent to the second agent;
    receiving the packet including the redundant acknowledgement sequence looped back from the second agent at the first agent;
    sending a test sequence from the first agent to the second agent;
    receiving the test sequence looped back from the first agent;
    determining whether the received redundant acknowledgment sequence is valid; and
    looping back the test sequence if the received redundant acknowledgment sequence is determined to be valid.

15. The article of claim 14, wherein the instructions for determining whether the received redundant acknowledgment sequence is valid comprise instructions for determining whether at least some number of bits of the received redundant acknowledgment sequence are correct.

16. The article of claim 14, wherein the redundant acknowledgment sequence comprises at least three bits.

17. The article of claim 14, wherein initiating loopback comprises recognizing that the second agent has entered a loopback mode by receiving a sent packet looped back from the second agent and wherein sending a packet including a redundant acknowledgment is performed after recognizing that the second agent has entered the loopback mode.

18. A multiple processor computing system comprising:
    a first processing agent; and
    a second processing agent; and
    a bidirectional communications bus connecting the first agent to the second agent,
    the first agent initiating loopback communications to the second agent, and sending a packet including a redundant acknowledgment sequence,
    the second agent sending a packet including the redundant acknowledgement sequence looped back to the first agent,
    the first agent sending a test sequence to the second agent, and the second agent sending the test sequence looped back from the first agent, wherein the first agent determines whether the received redundant acknowledgment sequence is valid, and loops back the test sequence if the received redundant acknowledgment sequence is valid.

19. The system of claim 18, wherein the first agent sends override information to the second agent and the second agent applies the received override information, the override information including offset and compensation values for the second agent to apply to configuration registers.

20. The system of claim 18, wherein the first agent analyzes the looped back test sequence and sets communications parameters based thereon.

* * * * *